United States Patent

Kobayashi et al.

[15] 3,641,562

[45] Feb. 8, 1972

[54] METHOD OF TIMING A SEQUENTIAL APPROXIMATION ENCODER

[72] Inventors: Toshio Kobayashi, Yokohama; Yukihiko Mineshima, Kawasaki, both of Japan

[73] Assignee: Fujitsu Limited, Kawasaki, Japan

[22] Filed: Feb. 9, 1970

[21] Appl. No.: 9,497

[30] Foreign Application Priority Data

Feb. 14, 1969 Japan ....................44/10898

[52] U.S. Cl. ....................340/347 AD

[51] Int. Cl. ....................H03k 13/02

[58] Field of Search ....................340/347

[56] References Cited

UNITED STATES PATENTS 3,484,779 12/1969 Zeniti Kiyasu et al. ................340/347

*Primary Examiner*—Maynard R. Wilbur

*Assistant Examiner*—Charles D. Miller

*Attorney*—Curt M. Avery, Arthur E. Wilfond, Herbert L. Lerner and Daniel J. Tick

[57] ABSTRACT

A method of coding in a plurality of unit coding circuit stages connected in cascade and of the same number as the coded bits comprises the steps of applying input signals to a first unit coding circuit stage, rectifying the input signals in the first stage, discriminating the polarity of the input signals in the first stage, successively applying the absolute value output signals of the first stage to the following stages for coding the absolute value signals, and converting the coded pulses of the following stages into series-coded pulses by discriminating the polarity of the input signals in the first stage in the coding period for the absolute value signals in the following stages.

1 Claims, 8 Drawing Figures

RECTIFIER

CODING CIRCUIT STAGE

METHOD OF TIMING A SEQUENTIAL APPROXIMATION ENCODER

DESCRIPTION OF THE INVENTION

The invention relates to a coding system. More particularly, the invention relates to a coding system in a pulse code modulated or PCM communication system or in an ordinary analog digital converter.

Generally, the conversion of an analog quantity to a digital quantity, which is known as coding, is accompanied by coding errors. These errors include the essential error caused by quantization. This essential error is not hereinafter discussed, unless specified. The error caused by the deviation of the circuit operation, and the like, from the ideal condition, is hereinafter considered.

Coding error is primarily divided into static error and dynamic error. Normally, the dynamic error in the pulse response of an amplifier or passive network decreases with the passage of time, and the relative error in a linear circuit is constant. In linear coding utilizing a coder, the magnitude of the quantizing step is constant, while the analog quantity to be handled in the coding procedure differs for each digit. That is, the load differs for each digit.

Therefore, if the allowable step error is definitely assigned to individual digits, the allowable relative error becomes increasingly less for the most significant load digit or MSD. A similar tendency is observed in the case of nonlinear coding. Thus, when coding is performed sequentially from the digit of greater load in a conventional system wherein a uniform interdigital time interval is selected, the step error is progressively increased, because the allowable relative error is less for the greater load digit.

The principal object of the invention is to provide a new and improved coding system.

An object of the invention is to provide a coding system in which dynamic errors are reduced.

An object of the invention is to provide a sequential coding system in which the dynamic error occurring in the analog pulse waveform response during coding is reduced.

An object of the invention is to provide a coding system which provides a substantially uniform waveform response time.

An object of the invention is to provide a coding system in which the waveform response time is approximately 80 percent lower than any known coding systems.

An object of the invention is to provide a coding system which may be produced with economy.

An object of the invention is to provide a coding system in which the dynamic coding error caused by waveform response of the circuit, and the like, is reduced by improving the time control.

An object of the invention is to provide a coding system which functions at high precision and high speed.

An object of the invention is to provide a coding system which functions with efficiency, effectiveness and reliability.

In accordance with the present invention, a coding system comprises an input for providing an input signal. A rectifier is connected to the input and rectifies the input signal. A coding circuit is connected to the rectifier and discriminates the polarity of the input signal and codes the absolute value of the input signal during the same period of time. An output connected to the rectifier and the coding circuit provides the coded signal.

The coding circuit codes the absolute value of the input signal with nonuniform interdigital time intervals.

The coding circuit simultaneously discriminates the polarity of the input signal and encodes the final bit of the input signal.

In accordance with the present invention, a method of coding comprises discriminating the polarity of an input signal and coding the absolute value of the input signal during the same period of time. The absolute value of the input signal is coded with nonuniform interdigital time intervals. The polarity of the input signal is discriminated simultaneously with the encoding of the final bit of the input signal.

In the coding system of the invention, the interdigital time interval is not uniform. An increasingly longer time is allocated to the coding of greater load digits. This causes a reduction in the difference in step error between the digits, so that the total time allocated for coding all the digits is utilized effectively to reduce the coding error.

In order that the invention may be readily carried into effect, it will now be described in reference to the accompanying drawings, wherein.

Figure 3:
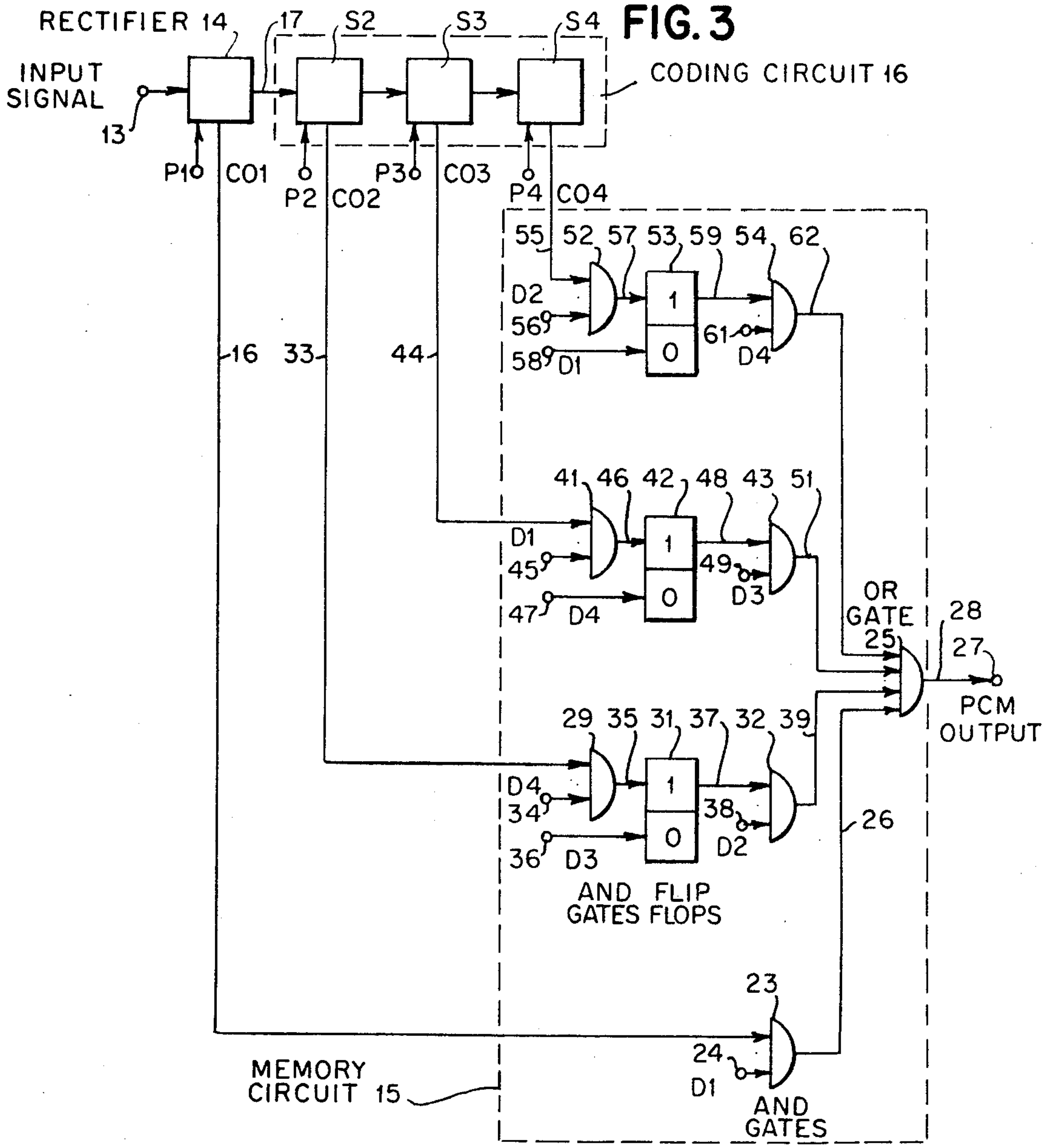
FIG. 3 is a block diagram of an embodiment of the coding system of the invention.
Figure 5A:
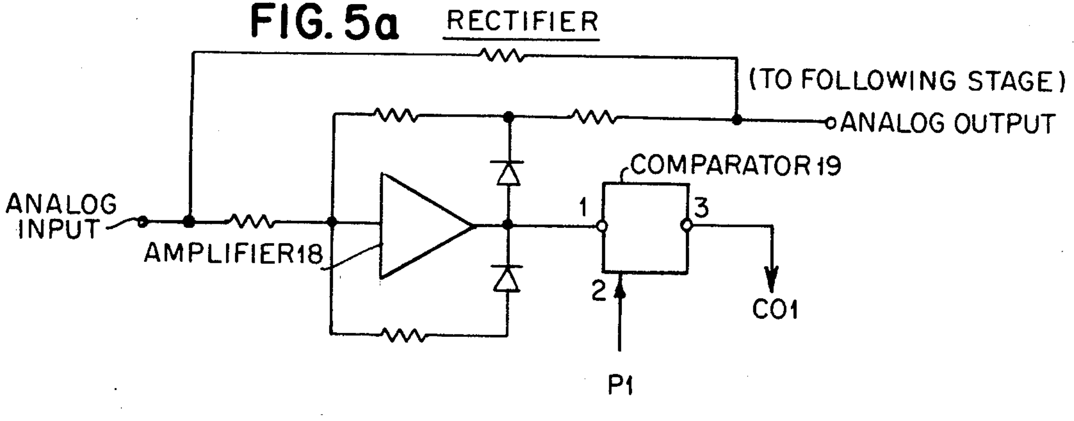
Figure 5B:
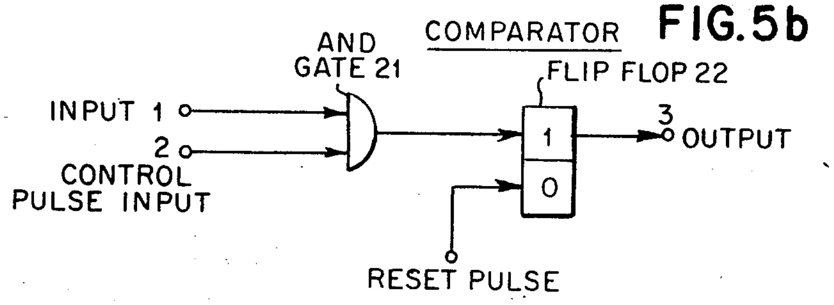
Figure 5C:
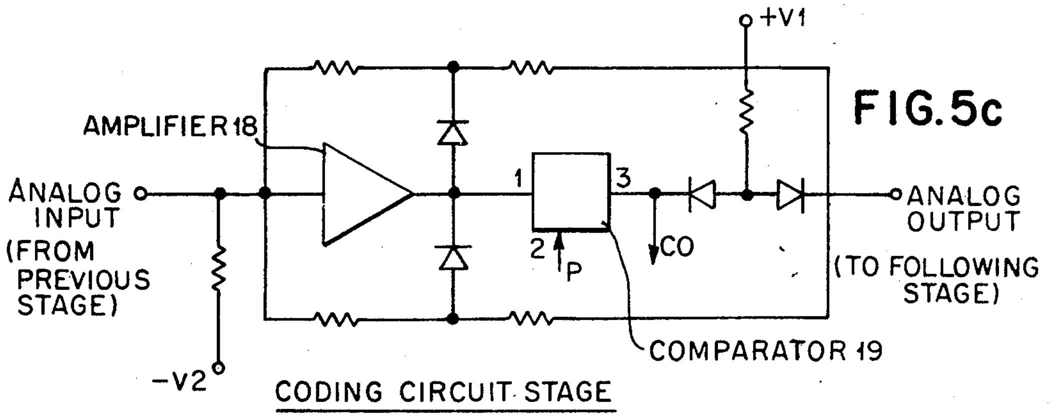
Figure 6:
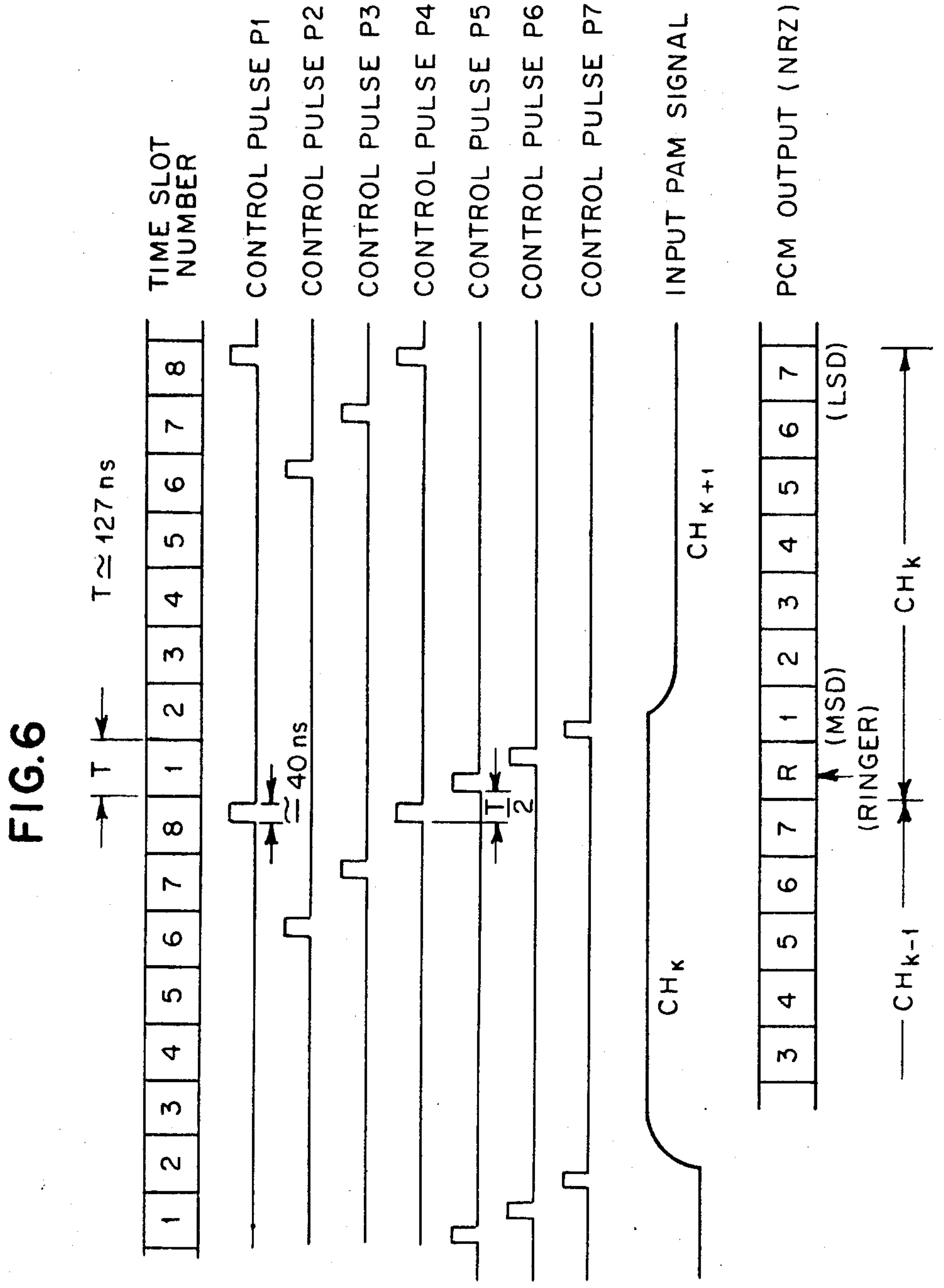

FIGS. 5*a*, 5*b*, and 5*c* are circuit diagrams of various components of the coding system of FIG. 3; and FIG. 6 is a graphical presentation of a plurality of curves illustrating the operation of another embodiment of the coding system of the invention.

Figure 1:
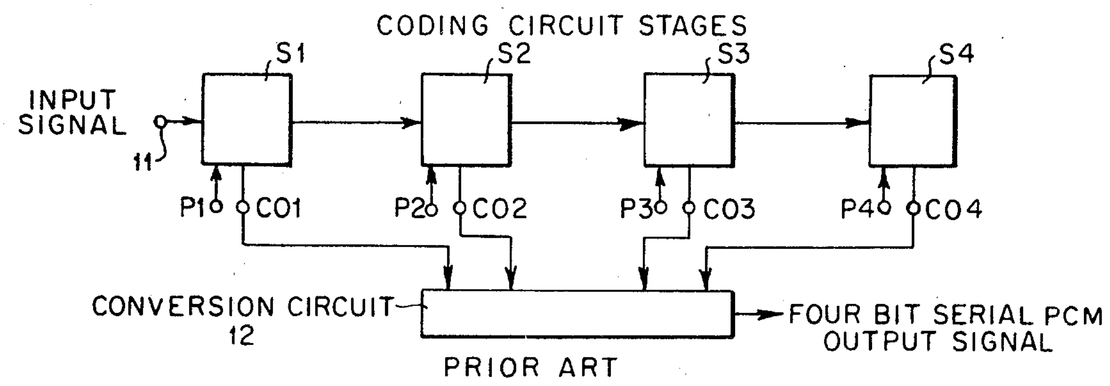
FIG. 1 is a block diagram of an embodiment of a known coding system.

The coding system of FIG. 1 is a known cascade nonlinear coder. The known coder of FIG. 1 is illustrated as a four-bit coding system, as an example. The coding system of FIG. 1 is fully described in U.S. Pat. No. 3,161,868, entitled "PCM Encoder," granted to Waldhauer on Dec. 15, 1964.

In FIG. 1, the input signal is supplied to an input terminal 11 and passes successively through the cascade-connected coding circuit stages S1, S2, S3 and S4. Each of the coding circuit stages S1, S2, S3 and S4 produces the PCM pulse of the corresponding digit. The PCM pulses C01, C02, C03 and C04, which are the digital outputs of the coding circuit stages S1, S2, S3 and S4, respectively, are supplied to a conversion circuit 12 which functions to convert said pulses to series PCM pulses.

Figure 2:
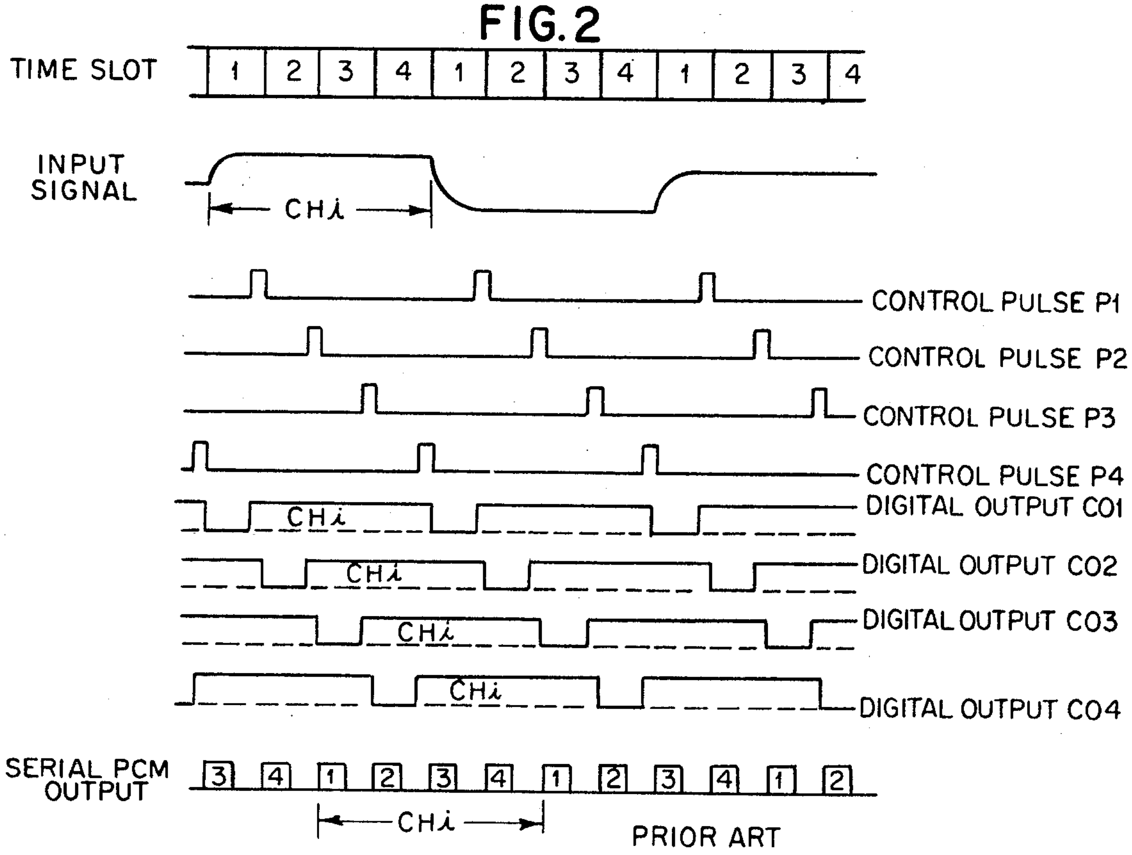
FIG. 2 is a graphical presentation of a plurality of curves illustrating the operation of the coding system of FIG. 1.

The conversion circuit 12 comprises any known conversion circuit which functions in the indicated manner and comprises AND-gates and OR-gates which may be controlled, for example, by a four-phase digit pulse. The curves illustrating the operation of the coder of FIG. 1 are shown in FIG. 2.

In FIG. 1, the curves P1, P2, P3 and P4 are the control pulses supplied to the coding circuit stages S1, S2, S3 and S4, respectively, and function to control the comparative detection of the comparator of each of said stages. The interdigital time interval is uniform. Therefore, the dynamic step error differs with each digit, and a defect occurs, since the most significant digit, which is the first digit, for example, becomes dominant, as hereinbefore described.

FIG. 3 illustrates an embodiment of the coder of the invention. The coder of FIG. 3 is a four-bit coder, for example. A PAM input signal is supplied to an input terminal 13. The input signal is supplied from the input terminal 13 to a rectifier 14, which rectifies it. The rectifier 14 produces a digital output C01 as a result of a polarity discrimination, in accordance with a detection control pulse P1 supplied to said rectifier. The digital output C01 is supplied by the rectifier 14 to an input of a memory circuit 15 via a lead 16. The rectified input produced by the rectifier is supplied to the input of a coding circuit 16 via a lead 17.

The coding circuit 16 comprises the same coding circuit stages S2, S3 and S4 as the known coding system of FIG. 3. The coding circuit 16 sequentially codes the absolute value of the rectified input signal produced by the rectifier 14. More particularly, the coding circuit 16 codes the second, third and fourth digits of the input signal.

FIG. 5*a* illustrates a circuit which may be utilized as the rectifier 14 of FIG. 3. FIG. 5*b* illustrates a circuit which may be utilized as the comparator of the rectifier of FIG. 5*a*. FIG. 5*c* illustrates a circuit which may be utilized as each of the second, and successive, coding stages of the coder. Each of the circuits of FIGS. 5*a*, 5*b*, and 5*c* are shown in the aforedescribed U.S. Patent.

The rectifier circuit of FIG. 5*a* includes an amplifier 18 and a comparator 19 and functions in the manner described in the aforementioned U.S. Patent. The comparator of FIG. 5*b* includes an AND-gate 21 and a flip-flop 22 and functions in the manner disclosed in the aforedescribed U.S. Patent. The coding circuit stage of FIG. 5*c* includes the amplifier 18 and the comparator 19 and functions in the manner described in the aforementioned U.S. Patent. The amplifier 18 is a high-gain broadband DC amplifier.

It is thus seen that the configuration, arrangement and operation of each coding stage of the coder of the invention is the same as those of the conventional coder. Our invention lies in the control of the coder stages.

As hereinbefore disclosed, in the known coding system and in the coding system of the invention, the digital outputs C01 and C04 of the first and fourth or final coding stages are different from the digital outputs C02 and C03 of the intermediate or second and third coding stages. That is, the digital outputs C02 and C03 not only provide the outputs of two digits of coded pulses, but are utilized for switching the bias values to be added to the analog outputs to be connected to the second and third coding stages, respectively. It is sufficient for the digital outputs C01 and C04 to simply provide such digital outputs, so that such outputs are not utilized for any other purpose. Since the digital outputs of the second and successive stages affect said second and successive stages, the coding of the absolute value must be performed sequentially from the second digit.

The analog output of the rectifier 14, which replaces the first coding stage, S1 of the known coder, is supplied to the second coding stage S2 of the coding circuit 16, in FIG. 3. The analog output supplied to the second coding stage S2 influences the second coding stage and the successive stages, but the digital output C01 of the rectifier 14 is irrelevant to the operation of any of the coding stages. The time for providing the digital output C01 is therefore not necessarily earlier than the provision of the digital output C02 by the second coding stage S2. If the time for providing the digital output C01 is selected to occur at some point during the period when the absolute value of the input signal is coded, there is no error in the coding operation. Since the error in waveform response decreases with the passage of time, the time for the polarity discrimination is preferably selected to be the longest permissible time after the supply of the input signal.

Figure 4:
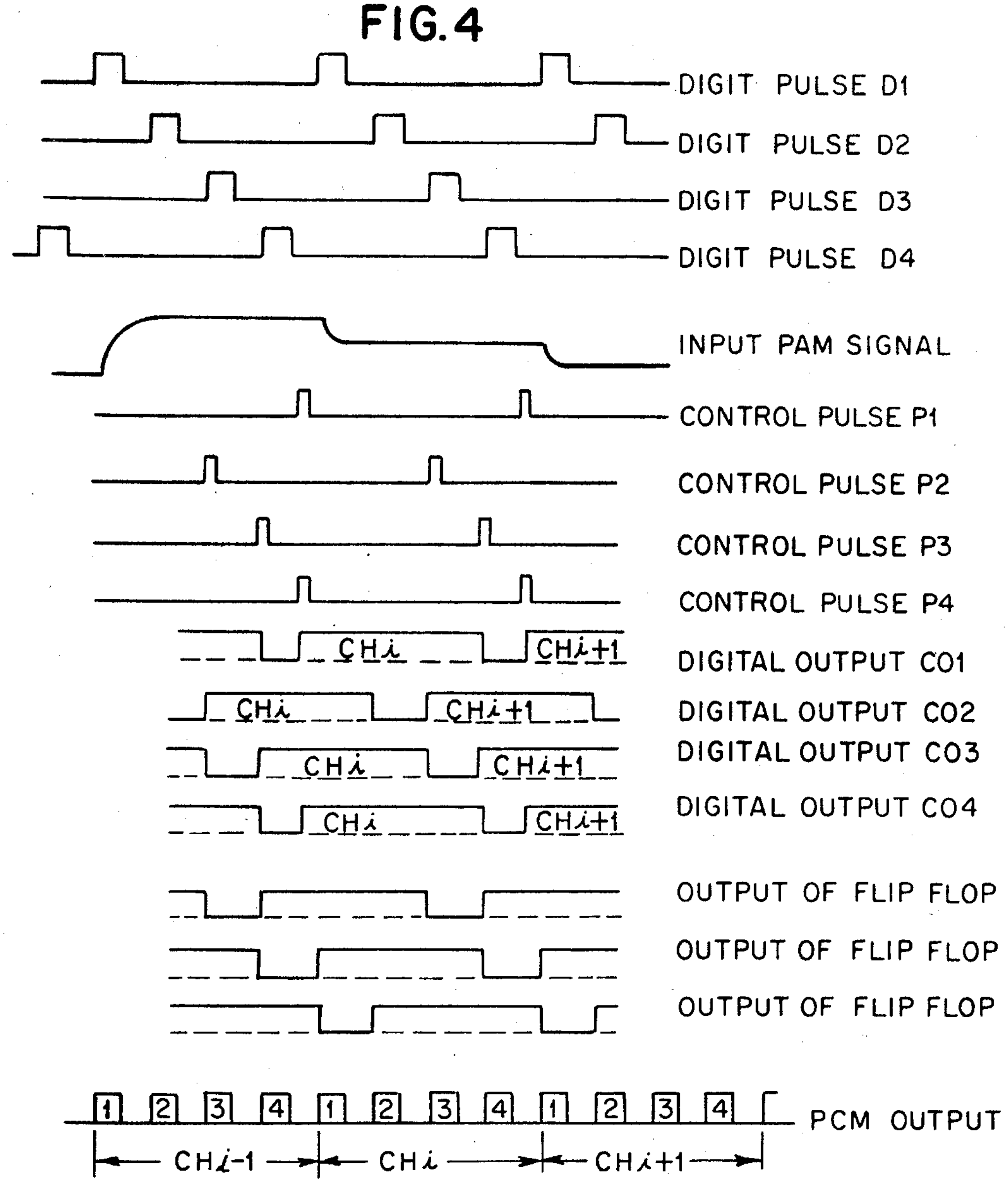
FIG. 4 is a graphical presentation of a plurality of curves illustrating the operation of the coding system of FIG. 3.

FIG. 4 illustrates the operation of the coder of FIG. 3, with particular emphasis on the control pulses and digital outputs. FIG. 4 illustrates the digit pulses D1, D2, D3 and D4, the control pulses P1, P2, P3 and P4 of the rectifier 14, the second coding stage S2, the third coding stage S3 and the fourth coding stage S4, respectively, and the digital outputs C01, C02, C03 and C04 of the rectifier 14, the second coding stage S2, the third coding stage S3 and the fourth coding stage S4, respectively. The control pulses P1 to P4 control the comparative detection time of the comparator of each coding stage.

In accordance with he invention, the polarity discrimination time is set so that it occurs immediately before the application of the next input sample value, thereby reducing the step error, caused by the waveform response error at the first stage, to a minimum. In the disclosed embodiment of the invention, the polarity discrimination is performed simultaneously with the coding or encoding of the final bit. The control pulse P1 may be provided at an optional time between the comparative detection of the second digit and the application of the next input sample value. Furthermore, the time interval between the control pulses P1, P2 and P3 provided at the comparative detection times of the second, third and fourth digits, during the coding of the absolute values, is unevenly allocated. That is, a longer time is allocated to the waveform response of the stage of the digit of the greater load, in order to reduce the dynamic coding error.

Since the polarity discriminating digit appears after the second digit, in accordance with the disclosed embodiment, when it is necessary to obtain as an output the series-coded pulses arranged in the order of digit number as in conventional practice, the output of each digit is temporarily recorded and then read out in the required order at the proper time interval. The memory circuit 15 of FIG. 3 functions to provide the required recording operation.

The memory circuit 15 is a known type of circuit comprising a three-bit circuit including flip-flops, writing gates and reading gates. Although a cascade-coding or encoding system is hereinbefore disclosed, any suitable known system is of similar utility, if it is of sequential coding type. Thus, for example, a known comparison feedback coding system may be utilized. In such a system, the control pulses P1 to P4, for controlling the comparative detection time, are not provided in a fixed cycle, as usual. In a four-bit system, for example, however, it is practicable to utilize a pulse formed by feeding control pulses P2, P3 and P4 into an OR-gate, as shown in FIG. 3. Although the foregoing descriptions relate to a four-bit system, the invention is not limited to such a system.

The memory circuit 15 comprises four branches. The first branch comprises an AND-gate 23 having one input connected to the output of the rectifier 14 via the lead 16. The digit pulse D1 is supplied to the other input of the AND-gate 23 via an input terminal 24. The output of the AND-gate 23 is connected to an input of an OR-gate 25 via a lead 26. The output of the OR-gate 25 is connected to an output terminal 27 of the coding system of FIG. 3 via a lead 28.

The second branch of the memory circuit 15 comprises an AND-gate 29 connected in series with a flip-flop 31 and an AND-gate 32. One input of the AND-gate 29 is connected to an output of the second coding stage S2 via a lead 33. The digit pulse D4 is supplied to the other input of the AND-gate 39 via a terminal 34. The output of the AND-gate 34 is connected to the set input of the flip-flop 31 via a lead 35. The digit pulse D3 is supplied to the reset input of the flip-flop 31 via a terminal 36. The set output of the flip-flop 31 is connected to a first input of the AND-gate 31 via a lead 37. The digital pulse D2 is a supplied to the second input of the AND-gate 32 via a lead 38. The output of the AND-gate 32 is connected to a second input of the OR-gate 25 via a lead 39.

The third branch of the memory circuit 15 of FIG. 3 comprises an AND-gate 41 connected in series with a flip-flop 42 and an AND-gate 43. The first input of the AND-gate 41 is connected to an output of the third coding stage S3 via a lead 44. The digit pulse D1 is supplied to the second input of the AND-gate 41 via a terminal 45. The output of the AND-gate 41 is connected to the set input of the flip-flop 42 via a lead 46. The digit pulse D4 is supplied to the reset input of the flip-flop 42 via a terminal 47. The set output of the flip-flop 42 is connected to the first input of the AND-gate 43 via a lead 48. The digit pulse D3 is supplied to the second input of the AND-gate 43 via a terminal 49. The output of the AND-gate 49 is connected to the third input of the Or-gate 25 via a lead 51.

The fourth branch of the memory circuit 15 comprises an AND-gate 52 connected in series with a flip-flop 53 and an AND-gate 54. The first input of the AND-gate 52 is connected to the output of the fourth coding stage S4 of the coding circuit 16 via a lead 55. The digit pulse D2 is supplied to the second input of the AND-gate 52 via a terminal 56. The output of the AND-gate 52 is connected to the set input of the flip-flop 53 via a lead 57. The digit pulse D1 is supplied to the reset input of the flip-flop 53 via a terminal 58. The set output of the flip-flop 53 is connected to the first input of the AND-gate 54 via a lead 59. The digit pulse D4 is supplied to the second input of the AND-gate 54 via a terminal 61. The output of the AND-gate 54 is connected to the fourth input of the OR-gate 25 via a lead 62.

FIG. 6 illustrates the operation of another embodiment of the coder of the invention. More particularly, FIG. 6 illustrates the time relation of the control pulses of another embodiment of the coder of the invention. The embodiment, whose operation is illustrated in FIG. 6, is a PCM coder which codes a seven-digit PCM signal. The time provided for code identification is sufficiently allotted to both the first and second stages, while only half of one time slot is allotted for the fourth and subsequent stages. When such time allotment is utilized, the required amplifier characteristics of each coding stage, and especially the waveform response time, may be made almost uniform. Furthermore, an amplifier having a waveform response time which is approximately 80 percent lower than a conventional coder may be utilized. This provides a significant contribution to economical production of the coding system of the invention.

While the invention as been described by means of a specific example and in a specific embodiment, we do not wish to be limited thereto, for obvious modifications will occur to those skilled in the art without departing from the spirit and scope of the invention.

We claim:

1. A method of analog-to-digital conversion in a plurality of unit coding circuit stages connected in cascade and of the same number as the coded bits, said method comprising the steps of applying analog input signals to a first unit coding circuit stage; rectifying the input signals in the first stage; discriminating the polarity of the input signals in the first stage; successively applying the rectified output signals of the first stage to the following stages and encoding it to parallel digital signals therein; converting the parallel digital signals from the said following stages into series-coded pulses timing the above steps such that the step of discriminating is done after the step of applying and during the step of encoding and such that the time interval between operation of each stage of the said plurality and operation of the stage following it is shorter than the time interval which occurred between operation of the stage prior to said each stage and operation of said each stage.

* * * * *